(12) United States Patent
Khellah et al.

(10) Patent No.: US 6,876,571 B1
(45) Date of Patent: Apr. 5, 2005

(54) STATIC RANDOM ACCESS MEMORY HAVING LEAKAGE REDUCTION CIRCUIT

(75) Inventors: Muhammad M. Khellah, Lake Oswego, OR (US); Dinesh Somasekhar, Portland, OR (US); Yibin Ye, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/738,220

(22) Filed: Dec. 18, 2003

(51) Int. Cl.[7] .............................................. G11C 11/00
(52) U.S. Cl. .................... 365/154; 365/230.06; 365/206
(58) Field of Search ........................... 365/154, 230.06, 365/206, 156

(56) References Cited

U.S. PATENT DOCUMENTS 6,327,215 B1 * 12/2001 Ternullo et al. ....... 365/230.06
6,560,139 B2 * 5/2003 Ma et al. .................... 365/154
6,678,202 B2 * 1/2004 Scott .......................... 365/154
2002/0141265 A1   10/2002 Somasekhar et al.

OTHER PUBLICATIONS

Azzez J. Bhavnagarwala et al., "The Impact of Intrinsic Device Fluctuations on CMOS SRAM Cell Stability", IEEE Journal of Solid–State Circuits, vol. 36, No. 4, Apr. 2001, pp. 658–665.

Ken'ichi Agawa et al., "A Bitline Leakage Compensation Scheme for Low–Voltage SRAMs," IEEE Journal of Solid–State Circuits, vol. 36, No. 5, May 2001, pp. 726–734.

* cited by examiner

Primary Examiner—Huan Hoang
(74) Attorney, Agent, or Firm—Fleshner & Kim, LLP

(57) ABSTRACT

A static random access memory (SRAM) is provided that includes a logic circuit coupled to a column select signal line and a leakage reduction circuit coupled to the logic circuit and a bit line pair of a column. The logic circuit may control the leakage reduction circuit so as to reduce leakage through a column select device that is not selected.

30 Claims, 8 Drawing Sheets

STATIC RANDOM ACCESS MEMORY HAVING LEAKAGE REDUCTION CIRCUIT

FIELD

Embodiments of the present invention relate to semiconductor memory design. More particularly, embodiments of the present invention relate to reducing bit line leakage in memory circuits.

BACKGROUND

In contemporary microprocessors, the size of embedded static random access memories (SRAMs) almost doubles every generation. Embedded SRAMs may provide better performance than off die memory. Large embedded SRAMs are typically designed using a small-signal approach (as compared to a full-swing approach) in order to maximize density. Unfortunately, a delay of a small-signal SRAM does not scale as well as a delay that of full-swing logic (like a register file). In the latter case, the delay is a function of the supply voltage (Vcc), which scales with technology.

In contrast, SRAM delay depends on a time that it takes a small memory cell to develop a sufficient differential voltage on a bitline. This differential voltage should be larger than an offset of a Sense-Amplifier (SA) used to convert the small differential input to a full-swing output. The SA offset may depend on random process variations, which tends to worsen with feature size scaling. Furthermore, sub-threshold leakage current, which roughly triples every generation, may add to the differential requirements. These factors make it difficult for the read access time to scale. Accordingly, additional circuit/architectural techniques are used to maintain cycle scaling.

BRIEF DESCRIPTION OF THE DRAWINGS

The foregoing and a better understanding of the present invention will become apparent from the following detailed description of arrangements and example embodiments (and the claims) when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

The following represents brief descriptions of the drawings in which like reference numerals represent like elements and wherein.

DETAILED DESCRIPTION

Figure 1:
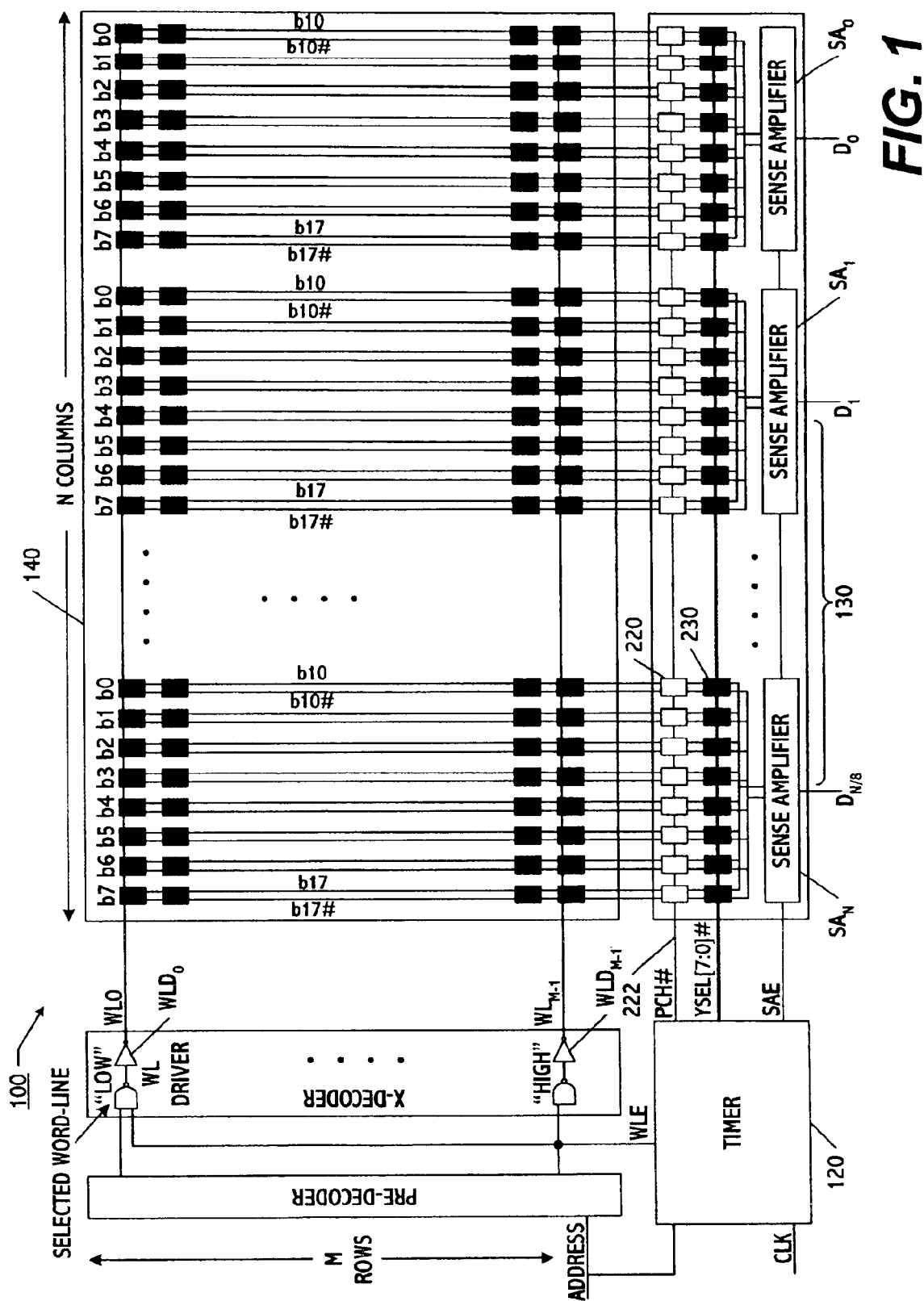
FIG. 1 illustrates an SRAM device according to an example arrangement.

In the following detailed description, reference is made to the accompanying drawings that show, by way of illustration, specific arrangements and embodiments in which the invention may be practiced. In the drawings, like numerals describe substantially similar components throughout the several views. These embodiments are described in sufficient detail to enable those skilled in the art to practice the invention. Other embodiments may be utilized, and structural, logical, and intellectual changes may be made without departing from the scope of the present invention. Moreover, it is to be understood that various embodiments of the invention, although different, are not necessarily mutually exclusive. For example, a particular feature, structure, or characteristic described in one embodiment may be included within other embodiments.

FIG. 1 illustrates a SRAM device 100 according to an example arrangement. Various components within the SRAM device 100 may be described with respect to FIGS. 2A–2D. Other arrangements are also possible. In this example, the SRAM device 100 includes a memory array (M rows and N columns) of memory cells. The SRAM device 100 may include a row decoder 110, a timer device 120, I/O devices (or I/O outputs 130), and a memory array 140 (of bit-cells). Bits of the same memory word are separated from each other for efficient 10 design. In this example arrangement, each of the N columns corresponds with 8 bit lines (or 8 bit-pairs). A plurality of sense-amplifiers $SA_{0-n}$ (n=(N/8)−1) may also be provided such that each group of eight columns may share a single sense amplifier SA. An 8-to-1 multiplexer (MUX) (not shown) may be used to connect each column to the SA during a READ operation. This 8-to-1 MUX may hereafter be referred to as a YSEL multiplexer (or device). Another 8-to-1 MUX (not shown) may be used to connect each column to a write driver during a WRITE operation.

Figure 2B:
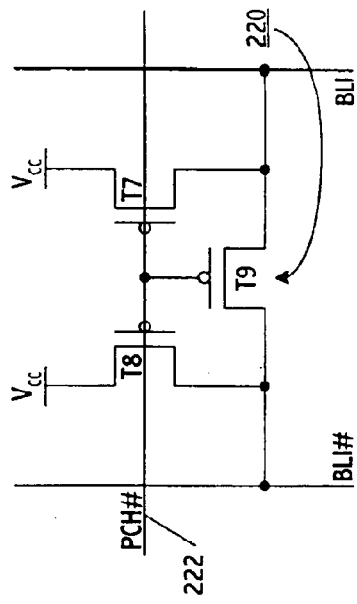
FIGS. 2A–2D illustrate various components of SRAM devices according to example arrangements.
Figure 2D:
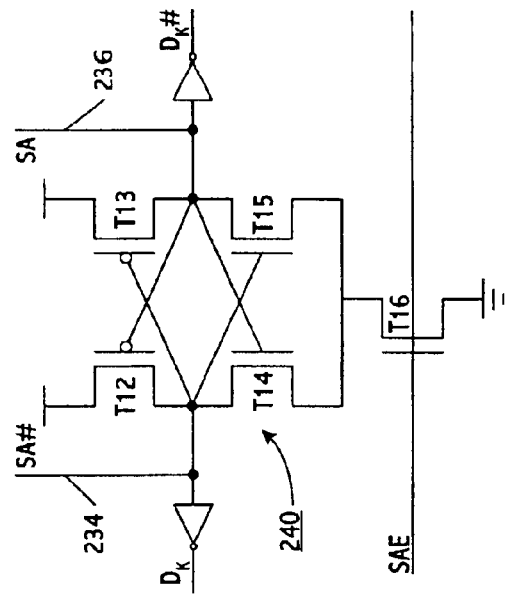
Figure 2A:
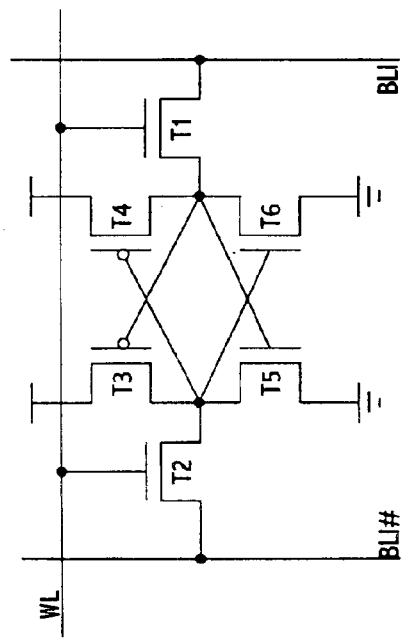

FIG. 2A is a close-up view of one of the memory cells within the memory array 140 according to an example arrangement. Other arrangements are also possible. FIG. 2A shows one configuration of transistors T1–T6 coupled between bit lines bli#, bli, and coupled to a word line WL.

Each bit line pair may be associated with a precharge circuit 220. Only one precharge circuit 220 is labeled in FIG. 1 for ease of illustration. FIG. 2B is a close-up view of the precharge circuit 220 having transistors T7–T9 according to one arrangement. Other arrangements are also possible. The precharge circuit 220 may be used to charge the associated bit lines (shown as bli# and bli in FIG. 2B) to a full supply voltage (Vcc) during a pre-charge phase of a clock (i.e., when the signal on PCH# line 222 is LOW). In FIG. 2B, the transistors T7–T9 are PMOS transistors.

Various ones of the word lines may be enabled by components within the row decoder 110. For example, the row decoder 110 may include a plurality of WL-drivers $WLD_{0-(M-1)}$, each corresponding with one of the word-lines $(WL_{0-(M-1)})$. In an evaluate phase, the pre-charge is turned OFF and one word-line $(WL_{0-(M-1)})$ may be enabled based on the row decoder 110. This is achieved by driving a selected word-line to Vcc via the corresponding WL-driver $WLD_{0-(M-1)}$. In FIG. 1, the word line WL0 is selected based on a LOW input to the WL-driver $WLD_0$. The other word lines are not enabled since the inputs to the respective WL-drivers $WLD_{1-(M-1)}$ are HIGH.

Figure 2C:
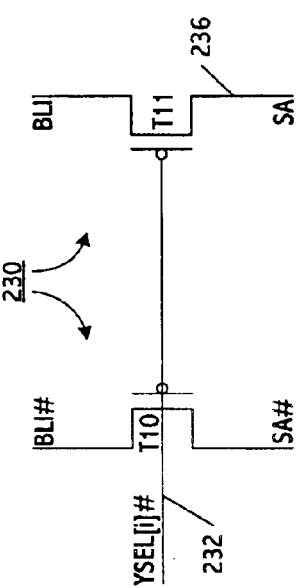

Each of the bit line pairs of the memory array 140 may be enabled by one of a plurality of column select circuits 230 (or column selectors). Only one column select circuit 230 is labeled in FIG. 1 for ease of illustration. Each column select circuit may simultaneously connect one of every eight bit line pairs $b_{0-7}$ to the corresponding SA. FIG. 2C is a close-up view of the column select circuit 230 having transistors T10 and T11 according to an example arrangement. The transistor T10 is coupled between the bit line bli# and a SA node sa#234. The transistor T11 is coupled between the bit line bli and a SA node 236. As shown, a column select signal (YSEL[i]#) 232 may be applied to gates of the transistors T10 and T11. Other arrangements are also possible.

FIG. 2D is a close-up view of a sense-amplifier (SA) circuit 240 having transistors T12–T16 according to an example arrangement. The SA circuit 240 may correspond to one of the SA circuits shown in FIG. 1. Other arrangements are also possible. During the precharge phase, SA nodes sa 236 and sa# 234 (FIGS. 2C and 2D) are precharged to Vcc through sense-amp precharge devices.

Depending on the cell content, one of the bit lines (either "bli" or "bli#" in FIGS. 2A–2C) may start dropping below Vcc thus developing a small differential voltage on the bit line pairs. The corresponding SA (i.e., SA 240 in FIG. 2D) amplifies this small voltage into full voltage output upon arrival of the sense amplifier enable (SAE) signal.

Figure 3:
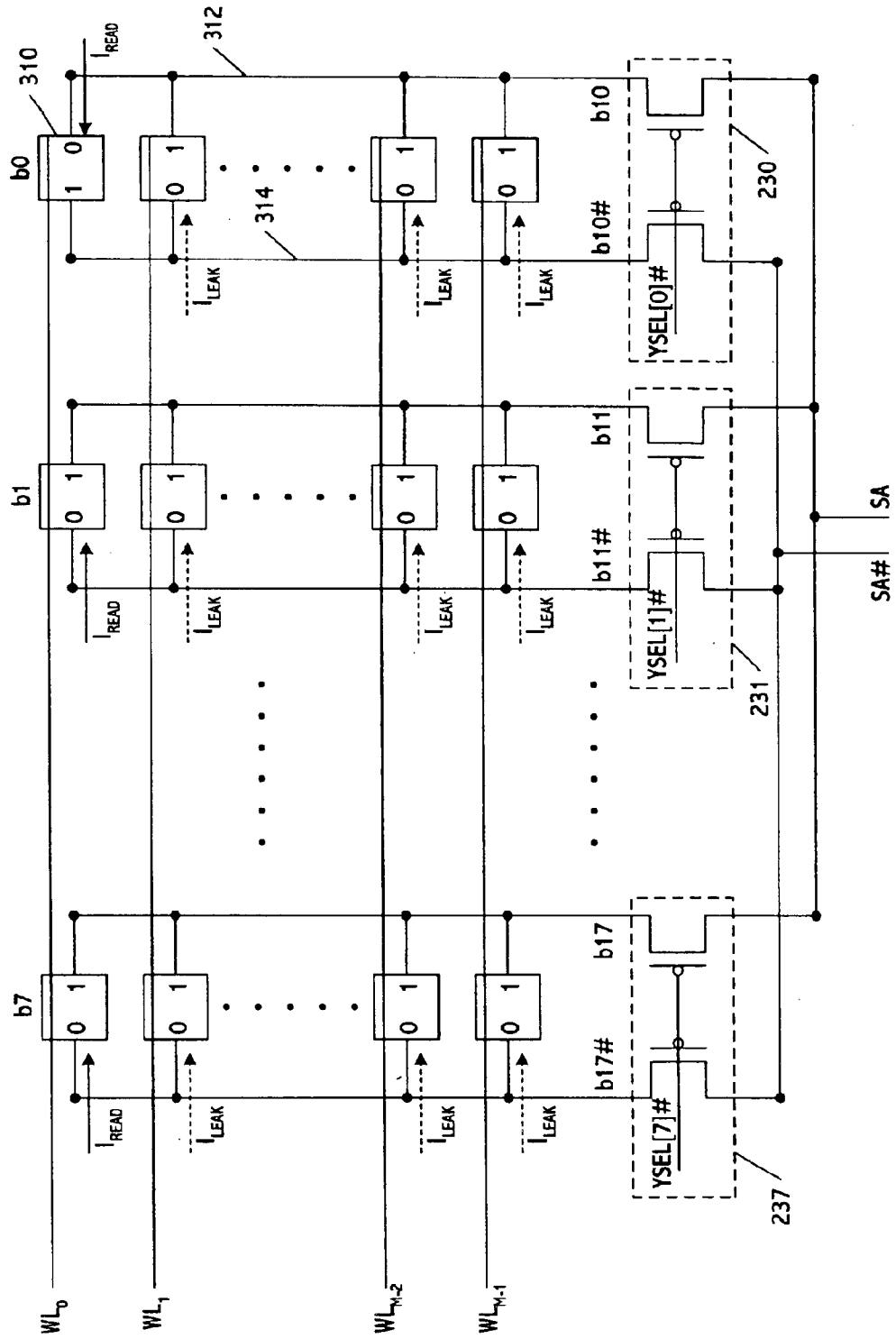
FIG. 3 illustrates a READ scenario for SRAM devices according to an example arrangement.

FIG. 3 illustrates a READ scenario of a SRAM device according to an example arrangement. Other arrangements are also possible. For ease of illustration and discussion, various components may not be labeled or discussed again since they were previously discussed. A bit-cell may be selected based on the selected word line and the selected column. As shown, a column may be selected by one of the column select circuits 230, 231 . . . 237. In this example, a bit-cell 310 may be selected based on the selected word line WL0 and the selected bit line (based on the selected column select circuit 230). The selected bit-cell 310 may discharge on one of bit lines 312 or 314 (bl0 or bl0#) having capacitance $C_{bl}$ with a discharge current of $I_{read}$. The amount of differential voltage developed between the bit lines 312, 314 may be larger than an offset of the SA before the SA is turned ON.

The SA offset may come from intrinsic process variations that cause a mismatch between the NMOS transistor pairs T14 and T15 shown in FIG. 2D. One arrangement to reduce this mismatch is to increase the size of these devices. This makes NMOS transistor pairs less susceptible to random fluctuations, which are most pronounced in minimum geometry devices as will be appreciated by those skilled in the art.

Further, drain leakage current may add to the minimum differential voltage requirement for the SA. There may be two sources for this leakage current: leakage from the selected bit line (e.g., bl0#); and/or leakage from unselected bit lines through the unselected column select circuits 221–227 (i.e., PMOS devices) as illustrated in FIG. 3.

With regard to leakage from the selected bit line, since M cells (corresponding to M rows) are located on a bit line, the unselected (M−1) cells may contribute a leakage current of $(M-1)I_{leak}$. Consequently the voltage differential between the bit lines 312, 314 may develop at the rate $dv/dt = (I_{read} - (M-1)I_{leak})/C_{bl}$, where $C_{bl}$ is the capacitance on BL only. Increased leakage may lead to a reduction in the rate of swing development (i.e., limits the frequency at which the SRAM can operate). The leakage may even overwhelm the drive current.

One possible arrangement may be to reduce the number of cells on the column (i.e., decrease M). This approach, known as BL segmentation, also helps in reducing read access time (or increase dv/dt) since $C_{bl}$ is decreased. However, the array efficiency may be sacrificed with this method, and thus the total SRAM area is increased. Furthermore, BL segmentation may have dimensioning returns when M becomes small (e.g., 32 or 16) as second level (post SA) multiplexing becomes dominant. Thus, this approach may not be scalable.

Injecting an opposite amount of current to exactly cancel $(M-1)I_{leak}$ is another alternative arrangement. Bit line leakage compensation as a means to counter-effect bit line leakage is known in the art. However, circuit complexity and implementation cost (in terms of extra bit line capacitance) limits this scheme to slow arrays with very large M (e.g., >512) to offset the associated overhead.

Still another arrangement is to increase the channel length of the memory cell pass devices (T1 and T2). This can effectively decrease leakage by orders of magnitude and also help in cell stability. However, this may come at the expense of delay as $I_{read}$ is reduced.

With regard to leakage from unselected bit lines, this leakage may occur through the unselected column selector's PMOS devices (i.e., corresponding to transistors T10 and T11). That is, during a READ operation, only the selected bit line will be read from. However, unselected bit lines on the same YSEL multiplexer (seven in this case) may also be ramping down. This ramping down per bit line may be due to both $I_{read}$ and $(M-1)I_{leak}$. The unselected bit lines may discharge much faster than the selected bit line because they are isolated from the large SA nodes and thus see less capacitive load. This may be particularly true for short bit lines (e.g., M=32), where up to Vcc/2 discharge is observed compared to only 50–100 mV on the selected bit line. Thus, a large $V_{ds}$ voltage may be seen across the OFF YSEL pass devices, increasing their Drain-Induced-Barrier-Lowering (DIBL) and correspondingly leakage current 331–337 through them. This leakage may impact the differential on the SA internal nodes (sa and sa#), requiring a longer wait time before the SAE is turned ON.

One arrangement is to use non-minimum length (e.g., weaker) pass devices as the column select circuits 230, 231 . . . 237. This may reduce leakage but may slow down the charge transfer from the selected bit line to the SA internal nodes, and increase the IR drop through the pass devices, thus adversely affecting the ramp rate.

Embodiments of the present invention may provide an SRAM that includes a logic circuit and a leakage reduction circuit. The logic circuit may be coupled to a column select signal line. The leakage reduction circuit may be coupled to the logic circuit and be configured to reduce leakage through an unselected column select device. For example, leakage through a YSEL pass devices may be reduced without compromising a differential voltage development rate.

Figure 4:
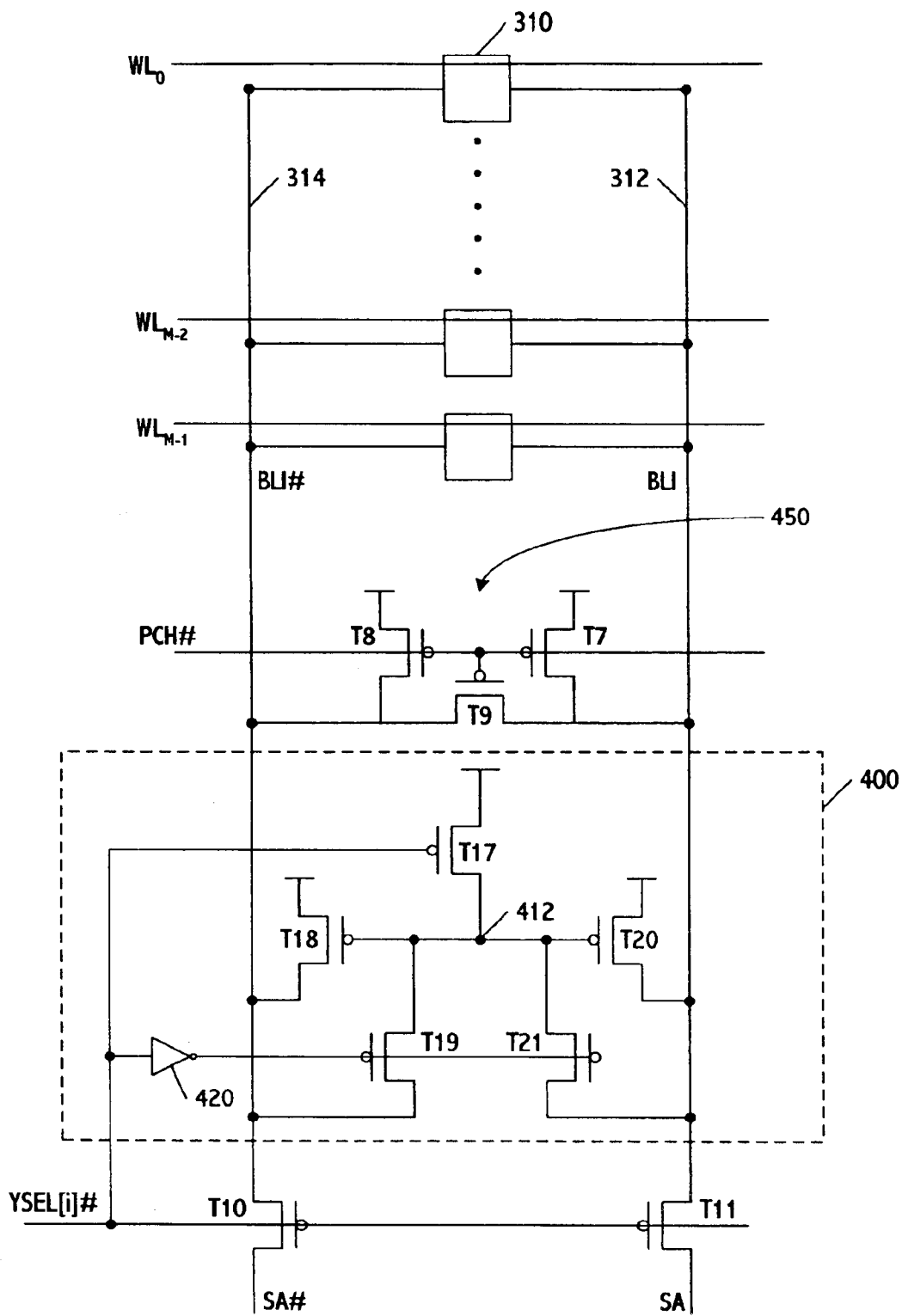
FIG. 4 is a circuit diagram of portions of a SRAM device according to an example embodiment of the present invention.
Figure 5:
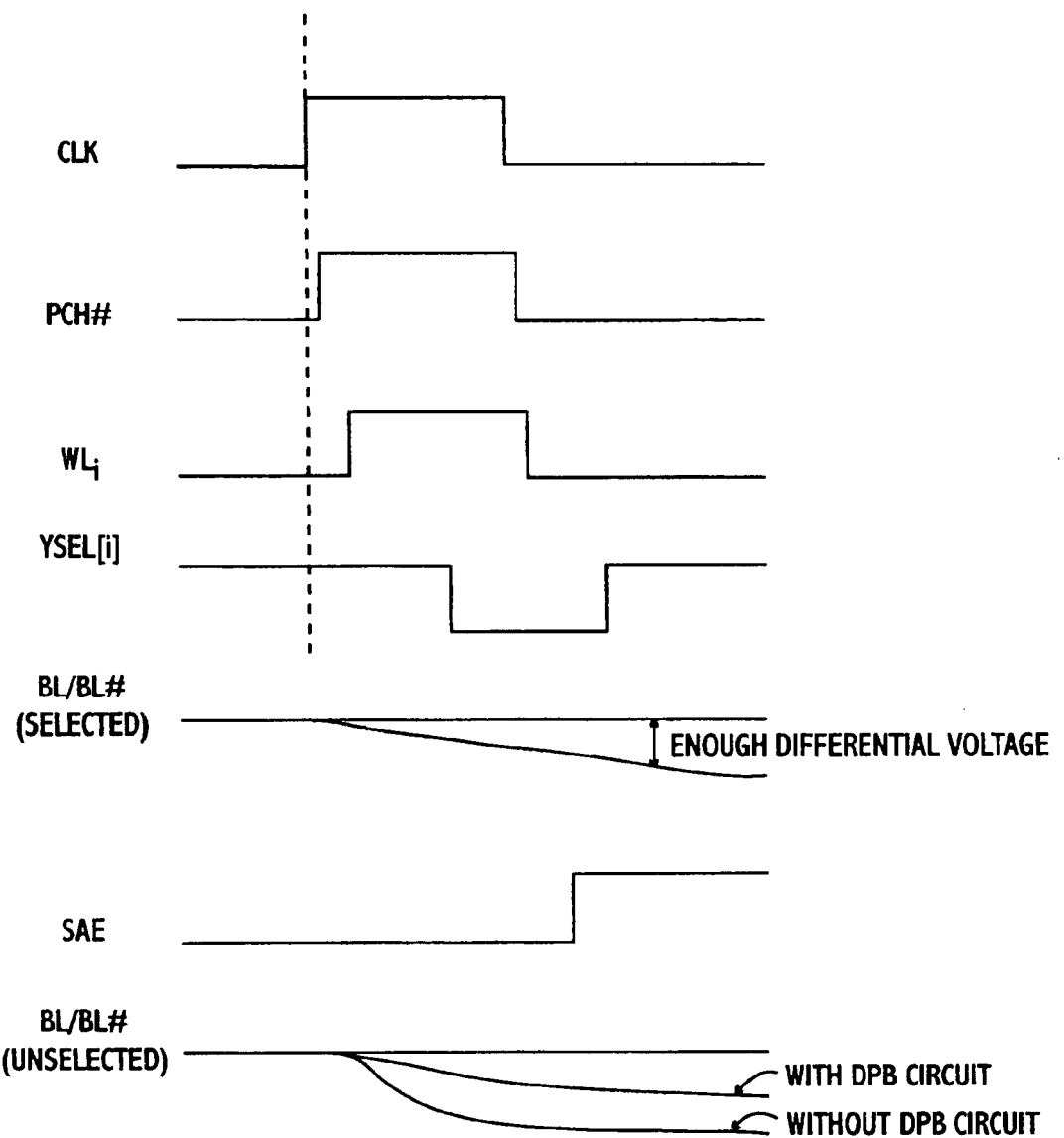
FIG. 5 is a timing diagram showing various signals according to an example embodiment of the present invention.

FIG. 4 illustrates portions of an SRAM device according to an example embodiment of the present invention. FIG. 5 is a timing chart showing various signals according to an example embodiment of the present invention. Other embodiments and configurations are also within the scope of the present invention. As shown in FIG. 4, the SRAM device may include a dynamically Biased Precharge (DBP) circuit 400 and a precharge circuit 450 (as well as various components that are not shown). The DBP 400 may include five PMOS devices (labeled T17–T21) and an inverter circuit (or inverter) 420, for example. The inverter circuit 420 may also be considered external to the DBP 400. The precharge circuit 450 may correspond to the precharge circuit 220 discussed above with respect to FIG. 1 and FIG. 2B. In this example, the precharge circuit 220 may be used to charge the bit lines bli#314 and bli 312 during a precharge phase (i.e., when a signal on PCH# is LOW).

After a precharge signal on the PCH# line is turned OFF (e.g., PCH# is HIGH) and a selected word line (e.g., $WL_0$) is turned ON, one of each bit line pairs 312 or 314 (bli or bli#) will start ramping down from Vcc. Meanwhile, just before the selected YSEL[i]# signal is driven LOW, the DPB circuit 400 may have no effect (or minimal effect) on the development rate of the selected bit line. This is because, although transistors T19 and T21 are ON, transistors T18 and T20 are OFF, and the ON Vgs voltage of transistors T19 and T21 is smaller than the threshold voltage (Vth). Since the YSEL[i]# signal may arrive later than the word line WL (as shown in FIG. 5, for example), the DPB circuit 400 may not interfere with differential voltage development across the bit lines 312 and 314. Once the YSEL[i]# signal is asserted (e.g., becomes LOW), the DPB circuit 400 of the selected bit line is turned OFF by disabling devices (e.g., transistors T19 and T21) through the inverter circuit 420, and turning ON transistor T17 which turns OFF the transistors T18 and T20.

In unselected columns, the corresponding DPB circuits will continue to be ON. When the voltage on unselected bit lines reaches Vcc–Vth, diodes (corresponding T18/T19 transistor pair and corresponding T20/T21 transistor pair) will barely turn ON and will oppose any further discharge on these bit lines. For example, transistors T18 and T20 are barely ON. The transistors T19 and T21 make sure that node 412 tracks any changes on bit lines 312, 314. As soon as either bit line 312 or bit line 314 reaches $V_{cc}-V_{th}$ then either transistors T18 or transistor T20 (or both) will turn ON and clamp the corresponding bit line to $V_{cc}-V_{th}$. Thus, unselected YSEL pass devices will have a Vds≈Vth. This may effectively reduce leakage through the unselected YSEL pass devices by reducing the DICL effect. Therefore, the negative impact on differential voltage development on the selected device may be reduced or eliminated. Accordingly, minimum length YSEL devices can be used to enhance development rate without compensating for leakage from the unselected devices.

Figure 6:
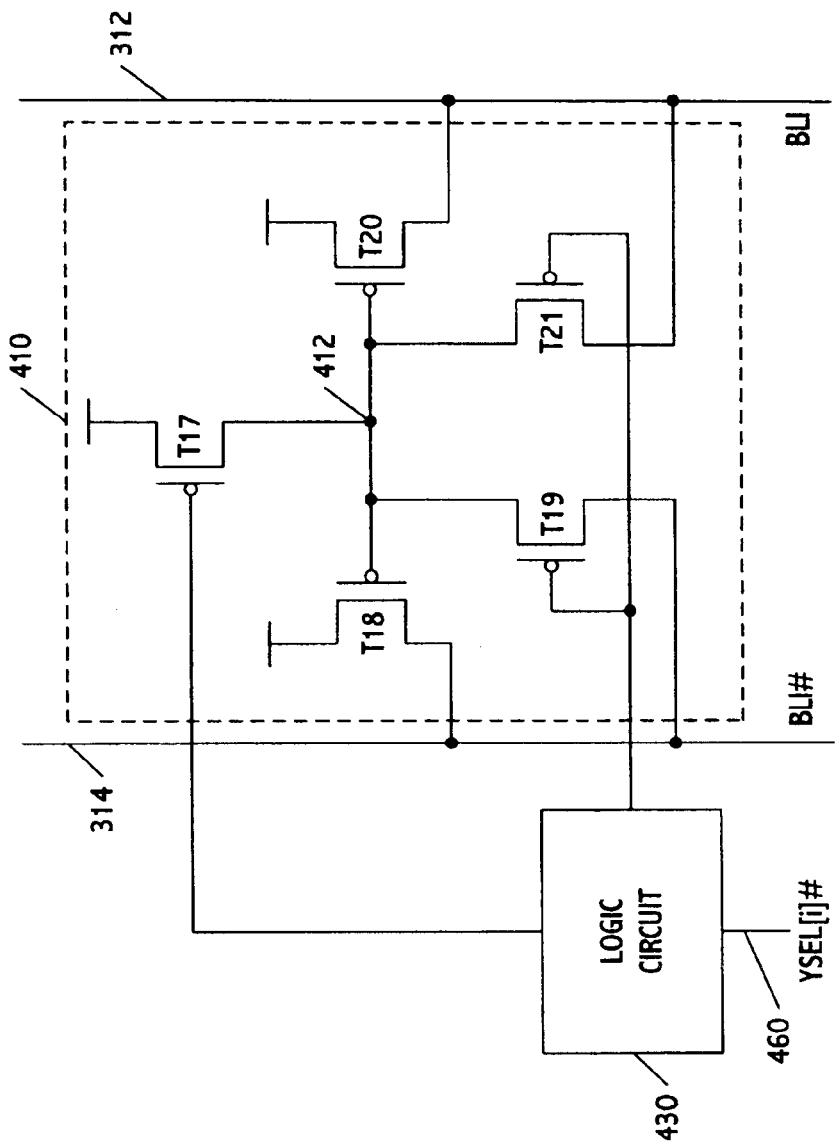
FIG. 6 is a circuit diagram of portions of a SRAM device according to an example embodiment of the present invention.

FIG. 6 illustrates portions of a SRAM device according to an example embodiment of the present invention. Other embodiments and configurations are also within the scope of the present invention. More specifically, FIG. 5 shows a DPB circuit 410 and a logic circuit 430 that may include logic to perform the features and interactions with the DPB circuit as described herein.

Embodiments of the present invention may include a static random access memory (SRAM) device having a logic circuit (such as the logic circuit 430) and a leakage reduction circuit (such as the DPB circuit 410) coupled to the logic circuit. The leakage reduction circuit may be configured to reduce leakage through a column select device (or circuit) that is not selected. As illustrated in FIG. 4, the logic circuit can be an inverter circuit 420 that inverts a column select signal. However, those skilled in the art will appreciate that other logic circuits can be used. Further, embodiments of the present invention may also be applicable to other types of devices, such as DRAMs that use gain cells (2T or 3T gain cells).

As shown in FIGS. 4 and 6, the leakage reduction circuit may include a transistor T17 coupled between a supply voltage and a common node 412. An input to the transistor T17 may be coupled to a column select line 460 (YSEL[i]#, either through a logic circuit (FIG. 6) or directly (FIG. 4).

Additionally, the transistor T18 and the transistor T20 have inputs coupled to the common node 412. The transistors T18 and T20 are also coupled between the supply voltage and the bit line (bli#) 314 and the bit line (bli) 312, respectively. The transistor T19 and the transistor T21 have inputs coupled to the logic circuit 430. The transistor T19 and the transistor T21 are coupled between the common node 412 and the bit line (bli#) 314 as well as the bit line 312, respectively. As illustrated in FIGS. 4 and 6, the transistors of the leakage reduction circuit 410 may be PMOS transistors.

Further, as illustrated with relation to FIG. 1, the SRAM device according to an example embodiment of the present invention may include a plurality of column select devices. Each column select device may be coupled to a corresponding logic circuit 430 and/or leakage reduction circuit 410. The SRAM device can be small-signal SRAM and can include a plurality of 6T memory cells, for example.

Further, leakage of the unselected column select devices may be reduced by maintaining a voltage across the column select device that is approximately a threshold voltage for the column selector. The column select device may include two transistors T10 and T11, each connected to one bit line of a bit line pair (such as bit lines bli# 314 and bli 312). Accordingly, when the transistors of the column select device are PMOS, then a voltage across the device is a drain to source voltage (Vds) and is approximately the threshold voltage (Vth).

Figure 7:
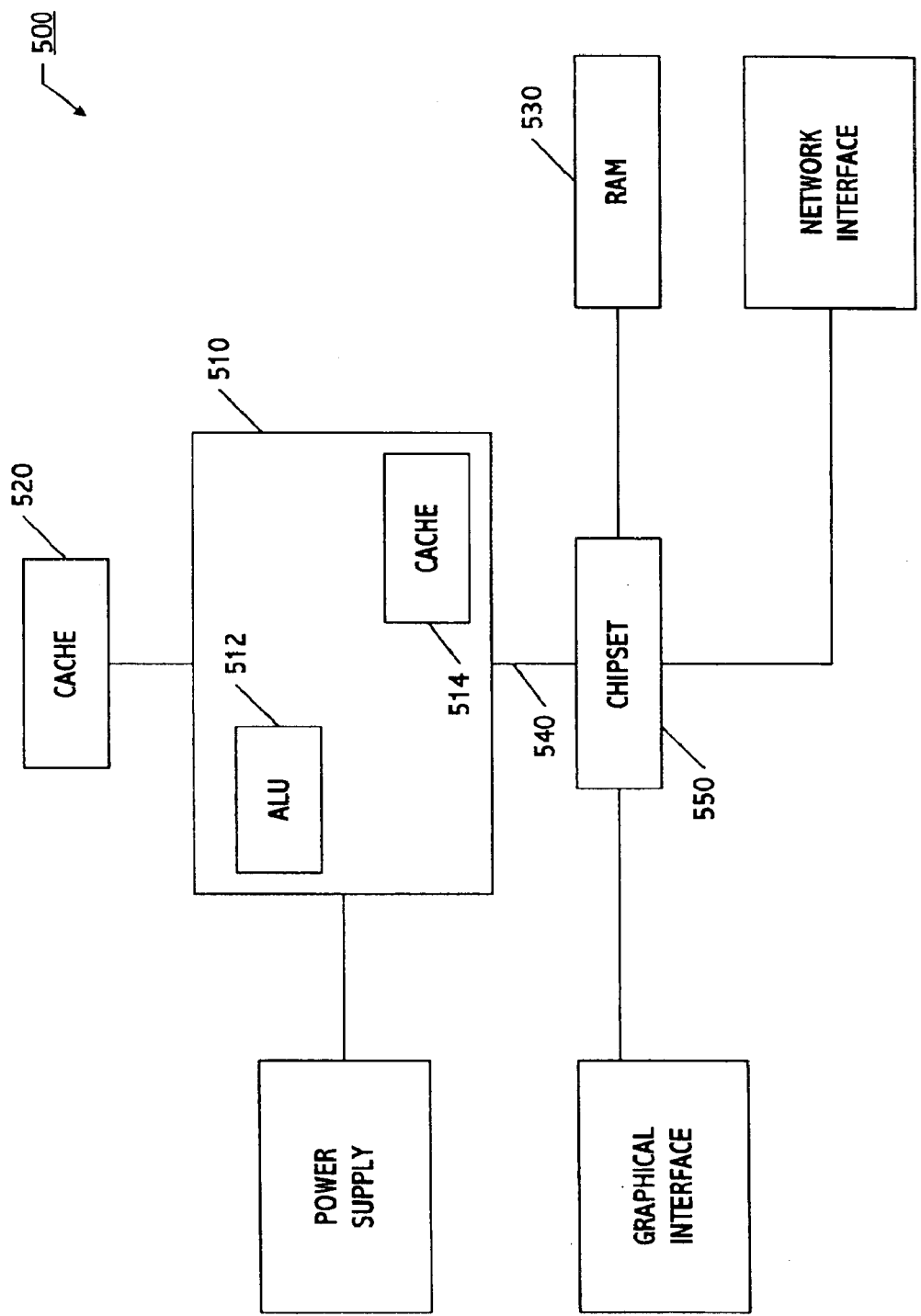
FIG. 7 is a system level block diagram of a computer system according to an example embodiment of the present invention.

Embodiments of the present invention can be used in a wide variety of applications including computer systems. FIG. 7 is a system level block diagram of a computer system according to an example embodiment of the present invention. Other embodiments are also within the scope of the present invention. A computer system 500 may include a microprocessor 510 that may have many sub-blocks such as an arithmetic logic unit (ALU) 512 and an on-die cache 514. The microprocessor 510 may also communicate to other levels of cache, such as off-die cache 520. Higher memory hierarchy levels such as system memory (or RAM) 530 may be accessed via a host bus 540 and a chip set 550. In addition, other off-die functional units such as a graphics accelerator and a network interface controller, to name just a few, may communicate with the microprocessor 510 via appropriate busses or ports. For example, the system memory 530, the off-die cache memory 520, and/or the on-die cache memory 514 may include SRAM devices as discussed above.

Figure 8:
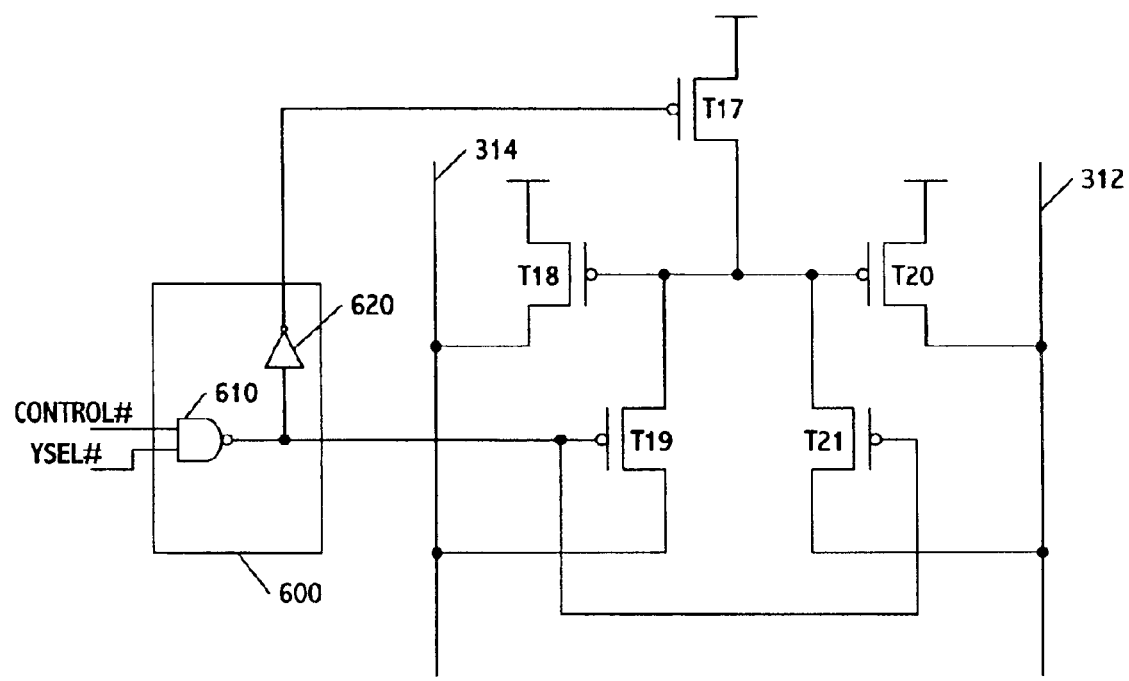
FIG. 8 is a circuit diagram showing a logic circuit and portions of a DPB circuit according to an example embodiment of the present invention.

The foregoing embodiments are merely exemplary and are not to be construed as limiting the present invention. The present teaching can be readily applied to other types of apparatuses. The description of embodiments of the present invention is intended to be illustrative, and not to limit the scope of the claims. Many alternatives, modifications, and variations will be apparent to those skilled in the art. For example, another logic circuit may be provided (compared to the inverter 420) to control turning ON of transistor T17 (and turning OFF of transistors T19 and T20) to disable the DPB circuit. FIG. 8 is a circuit diagram showing a logic circuit and portions of a DPB circuit according to an example embodiment. As shown, a logic circuit 600 may include a NAND gate 610 and an inverter 620. The circuit shown in FIG. 8 may be useful to reduce the DC currents from transistors T18 and 120, for example, during a WRITE operation. During a WRITE operation, one bit line (for example bit line 312) will go almost to $V_{ss}$ (0 Volts) and the other bit line (for example bit line 314) will remain HIGH. This may cause a large (write) DC current for transistor T20 to the inverter 620 (or writing circuit). To cut this DC current, the logic circuit shown in FIG. 8 may be used. The circuit shown in FIG. 8 may also be used in a low-power device where enough time is available for the differential development during a READ operation, but reducing DC currents is more important. That is, the (read) DC current may be between transistors T20 or T21 and the "0" side of the memory cell when WL is ON.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A static random access memory (SRAM) device comprising:
   a logic circuit coupled to receive a column select signal line at an input; and
   a leakage reduction circuit coupled to receive an output of the logic circuit, the leakage reduction circuit configured to reduce leakage through an unselected column select device based on the input to the logic circuit.

2. The SRAM device of claim 1, further comprising:
   a plurality of column select devices including the unselected column select device.

3. The SRAM device of claim 2, further comprising:
   a plurality of other leakage reduction circuits each associated with a corresponding one of the column select devices.

4. The SRAM device of claim 2, further comprising:
   a plurality of other logic circuits each coupled to a corresponding column select signal line; and
   a plurality of leakage reduction circuits each coupled to a corresponding one of the plurality of other logic circuits.

5. The SRAM device of claim 1, wherein the logic circuit comprises an inverter to invert a signal on the column select signal line.

6. The SRAM device of claim 1, wherein the leakage reduction circuit comprises:
   a first transistor coupled between a supply voltage and a common node, an input to the first transistor coupled to the column select signal line;
   second and third transistors having inputs coupled to the common node, the second and third transistors coupled between the supply voltage and first and second bit-lines, respectively; and
   fourth and fifth transistors having inputs coupled to the logic circuit, the fourth and fifth transistors coupled between the common node and the first and second bit-lines, respectively.

7. The SRAM device of claim 1, wherein the leakage reduction circuit reduces the leakage through the unselected column select device by maintaining a voltage across the unselected column select device that is approximately a threshold voltage for the unselected column select device.

8. The SRAM device of claim 1, wherein the unselected column select device comprises two transistors each coupled to one bit line of a bit line pair.

9. The SRAM device of claim 8, wherein the transistors are PMOS transistors and a voltage drain to source (Vds) is approximately a threshold voltage.

10. The SRAM device of claim 1, wherein the leakage reduction circuit comprises:
    a first transistor pair coupled to a bit line pair of a column; and
    a second transistor pair coupled to the bit line pair and coupled to a first node between the first transistor pair, the first and second transistor pairs configured to maintain a voltage across the unselected column select device that is approximately a threshold voltage for the unselected column select device.

11. The SRAM device of claim 10, wherein the unselected column select device comprises PMOS transistors and a voltage drain to source (Vds) is approximately the threshold voltage.

12. A static random access memory (SRAM) device comprising:
    a plurality of column select devices each to select a corresponding column of memory cells based on corresponding column select signals; and
    a plurality of leakage reduction circuits each coupled to a corresponding one of the column select devices, each leakage reduction circuit to reduce leakage through the corresponding column select device based on a received column select signal.

13. The SRAM device of claim 12, further comprising a plurality of logic circuits each associated with a corresponding one of the leakage reduction circuits, each logic circuit coupled to receive a corresponding column select signal.

14. The SRAM device of claim 13, wherein one of the logic circuits comprises an inverter.

15. The SRAM device of claim 12, further comprising a circuit to provide column select signals for the plurality of column select devices.

16. The SRAM device of claim 12, wherein each leakage reduction circuit reduces leakage through the corresponding column select device when the column select device is an unselected column select device.

17. The SRAM device of claim 16, further comprising a sense amplifier to amplify a signal on a selected column, the sense amplifier coupled to the plurality of column select devices.

18. A static memory access memory (SRAM) device comprising:
    a first column select device to receive a first column select signal;
    a second column select device to receive a second column select signal;
    a first leakage reduction circuit associated with the first column select device; and a second leakage reduction circuit associated with the second column select device, the first leakage reduction circuit to reduce leakage of the SRAM device when the second column select device is selected.

19. The SRAM device of claim 18, further comprising a first logic circuit associated with the first column select device and coupled to the first column select signal.

20. The SRAM device of claim 19, further comprising a second logic circuit associated with the second logic circuit and coupled to the second column select signal.

21. The SRAM device of claim 19, wherein the first logic circuit comprises an inverter.

22. The SRAM device of claim 18, further comprising a memory cell array.

23. The SRAM device of claim 22, further comprising a sense amplifier to amplify a signal on a selected column, the sense amplifier coupled to the plurality of column select devices.

24. An electronic system comprising:
 a processor device to process data; and
 a SRAM device to store the data, the SRAM device including:
  a plurality of memory cells;
  a first column select device to receive a first column select signal representative of a column of the memory cells;
  a second column select device to receive a second column select signal representative of a column of the memory cells;
  a first leakage reduction circuit associated with the first column select device; and
  a second leakage reduction circuit associated with the second column select device.

25. The electronic system of claim 24, wherein the first leakage reduction circuit reduces leakage of the SRAM device when the second column select device is selected.

26. The electronic system of claim 24, further comprising a first logic circuit associated with the first column select device and coupled to the first column select signal.

27. The electronic system of claim 24, further comprising a second logic circuit associated with the second logic circuit and coupled to the second column select signal.

28. The electronic system of claim 24, further comprising an input device to input data into one system.

29. The electronic system of claim 24, further comprising a memory cell array.

30. The electronic system of claim 29, further comprising a sense amplifier to amplify a signal on a selected column of the memory cell array.

* * * * *